(12) United States Patent
Shin et al.

(10) Patent No.: US 11,193,203 B2
(45) Date of Patent: Dec. 7, 2021

(54) MASK FOR DISPLAY

(71) Applicant: LG Display Co., Ltd., Seoul (KR)

(72) Inventors: JaeWon Shin, Paju-si (KR); YunMi Lee, Paju-si (KR); Yunbae Kim, Paju-si (KR); DaeSeon Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 174 days.

(21) Appl. No.: 16/727,722

(22) Filed: Dec. 26, 2019

(65) Prior Publication Data

US 2020/0208259 A1    Jul. 2, 2020

(30) Foreign Application Priority Data

Dec. 28, 2018   (KR) .......................... 10-2018-0172069

(51) Int. Cl.
| | | |
|---|---|---|
| *C23C 16/04* | (2006.01) | |
| *H01L 51/00* | (2006.01) | |
| *H01L 27/32* | (2006.01) | |

(52) U.S. Cl.
CPC ........ *C23C 16/042* (2013.01); *H01L 27/3244* (2013.01); *H01L 51/0011* (2013.01)

(58) Field of Classification Search
CPC .......................... C23C 16/042; H01L 51/0011
See application file for complete search history.

(56) References Cited

U.S. PATENT DOCUMENTS

| | | | | |
|---|---|---|---|---|
| 2004/0214449 | A1* | 10/2004 | Yotsuya ................. | C23C 14/12 438/742 |
| 2007/0126681 | A1* | 6/2007 | Goden ................ | H01L 51/5012 345/92 |
| 2007/0137568 | A1* | 6/2007 | Schreiber .............. | C23C 14/562 118/718 |
| 2015/0013600 | A1* | 1/2015 | Hsu ....................... | C23C 14/042 118/504 |

FOREIGN PATENT DOCUMENTS

KR    2000-0067353 A    11/2000

* cited by examiner

*Primary Examiner* — Keath T Chen
(74) *Attorney, Agent, or Firm* — Seed IP Law Group LLP (57) ABSTRACT

The present disclosure relates to a mask for manufacturing a display. A mask for display according to the embodiment of the present disclosure comprises an aperture corresponding to a display area, a dummy aperture near the aperture, a rib surrounding circumferences of the aperture and the dummy aperture, and a sub rib between the aperture and the dummy aperture.

14 Claims, 5 Drawing Sheets

MASK FOR DISPLAY

CROSS-REFERENCE TO RELATED APPLICATIONS

This application claims the benefit of the Korean Patent Application No. 10-2018-0172069 filed on Dec. 28, 2018, which is hereby incorporated by reference as if fully set forth herein.

BACKGROUND

Technical Field

The present disclosure relates to a mask for manufacturing a display having various shapes.

Description of the Related Art

The electroluminescence display, as a self-luminescence device, has characteristics of having superior viewing angle and contrast ratio, light weight, thin thickness due to the absence of a back light unit, and low electric power consumption. Among the various types of electroluminescence displays, the organic light emitting display can be driven with a direct current and low voltage, has a fast response time, and can be manufactured at a relatively lower cost than other display devices.

The electroluminescence display includes a plurality of the light emitting diodes. The light emitting diode includes an anode electrode, a light emitting layer formed on the anode electrode, and a cathode electrode on the light emitting layer. As the high level voltage is applied to the anode electrode and the low level voltage is applied to the cathode electrode, the hole from the anode electrode and the electron from the cathode electrode moves to the light emitting layer and. The excitons are generated by the combination of electrons and holes and then the light emitting layer emits light by the energy formed as excitons are dropped from an exited state to a ground state. By controlling the amount of light generated at each of the light emitting layers of the light emitting diodes, the electroluminescence display represents image data, video data.

In order to provide the full color video images, the electroluminescence comprises various emission elements including a red emission layer, a green emission layer and a blue emission layer. These emission elements may be formed by a deposition process using a shadow mask for depositing thin film.

The mask for thin film deposition may be the fine metal mask made of metal material called as the invar. Here, the invar may be an alloy material of the iron and the nickel, having a low thermal expansion factor. There are two methods for manufacturing the invar alloy (36% Ni-64% Fe) or the super invar alloy (32% Ni-63% Fe-5% Co), the one is the cold-rolling method and the other is the electro-forming method. As the cold-rolling method is not suitable for the large area display, the fine metal mask is manufactured by the electro-forming method. In the method for manufacturing the fine metal mask using the electro-forming method, an anode electrode and a cathode electrode are disposed in parallel with facing each other inside of a coating (or plating) tank, and then a coating plate is disposed between the anode electrode and the cathode electrode. By filling the tank with an electrolytic solution and then applying the electric current from the anode electrode to the cathode electrode, the invar alloy layer is formed on one side the coating plate. After that, by separating the invar alloy layer from the coating plate and conducting a post-process, the fine metal mask is finally formed.

Generally, the display has a rectangular active area and the fine metal mask also has a rectangular aperture area corresponding to the rectangular active area. However, in some designs, the free-form display may have an active area of which shape is not rectangular shape such as a circle shape, an ellipse shape, a cloud shape, a trapezoid shape and so on.

BRIEF SUMMARY

In this regard, the present disclosure provides a fine metal mask for manufacturing a free-form electroluminescence display. The fin metal mask for the free-form display may have an aperture corresponding to the active area of the free-form display. When attaching the fine metal mask to the frame which is mounted in the deposition equipment, the tension stress may be concentrated on the free-form portion or at a boundary portion where two different shapes are joined. Hereinafter, we called this boundary portion as a 'shape-changed portion' or a 'free-form portion'. The stress concentration on the free-form portion may cause a distortion of the fine metal mask such as a partial bending or bowing and a partially erected portion. The distortion of the fine metal mask may cause the failure of the precise deposition quality and the deterioration of the display quality. The present disclosure provides a fine metal mask suitable for manufacturing a free-from electroluminescence display. The present disclosure further provides a fine metal mask for display by which the thickness of the light emitting layer is deposited uniformly and which has a shape corresponding to the shape of a designed display as manufacturing the free-form electroluminescence display.

A mask for display according to one embodiment of the present disclosure comprises an aperture corresponding to a display area, a dummy aperture near the aperture, a rib surrounding circumferences of the aperture and the dummy aperture, and a sub rib between the aperture and the dummy aperture.

A mask for display according to another embodiment of the present disclosure comprises a first aperture corresponding to a display area of a first substrate, a second aperture near to the first aperture within the first substrate, a first rib disposed to at least two sides of the first aperture and to at least two sides of the second aperture, and a second rib disposed between the first aperture and the second aperture.

The detailed explanations for various embodiments are included in the preferred embodiments and figures.

By including a dummy aperture at the area between apertures corresponding to the shape of the display area, the ribs disposed between the apertures may be applied with a constant tensile force. Therefore, the ribs between the apertures may be disposed over the surface of the substrate with a constant gap from the surface and a constant tensile force. Furthermore, as disposed on the surface, all portions of the ribs may settle on at the same time. As the results, the ribs of the mask do not have a partially soaring portion or partially sagged portion. With this condition, the emission layer deposited the following process step may be deposited with a continuously uniform thickness and an exact shape as designed. Further, according to the present disclosure, the electroluminescence display does not have the deposition failure such that the emission layer is not deposited on the wanted area or is deposited on the unwanted area. With the mask for display according to the present disclosure, the free-form display may have a superior video quality as the emission layer is deposited in the best condition.

To this end, when manufacturing the free-from display, the fine metal mask is preferred to have a free-from aperture area corresponding to the active area of the free-form display. For depositing an organic material, it is beneficial to ensure the flatness of the fine metal mask. When the fine metal mask is not held in a flat condition in the deposition equipment, the organic coating layer depositing on the substrate of the display may be distorted or may not have the uniform thickness, so that the organic emission element fails to ensure a desirable property, which can be corrected as set forth in the disclosure herein. Therefore, one aspect of the present disclosure is to develop the fine metal mask suitable for manufacturing the free-form electroluminescence display.

Other features and advantages of the present disclosure, besides the effects of the present disclosure mentioned above, will be described below, or may be apparent to those skilled in the art from the description and the description.

The scope of the claims is not limited by what is described in the contents of this disclosure, as the contents of the disclosure described in the above-mentioned subject matter, the problem solving means and the effect to be solved do not specify essential features of the claims.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," "adjacent," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal (or X) axis direction," "second horizontal (or Y) axis direction," and "vertical (or Z) axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, referring to figures, we will explain about some embodiments of the free-form electroluminescence display according to the present disclosure. For the reference numerals to the constituent elements of the drawings, the same constituent elements may have the same numbers as possible even though they are displayed on different drawings. The free-form shape may have a rectangular shape and a non-rectangular shape. Therefore, the arrangement of a plurality of free-form shapes may have an ununiformed distance between two neighboring free-form shapes.

Figure 1:
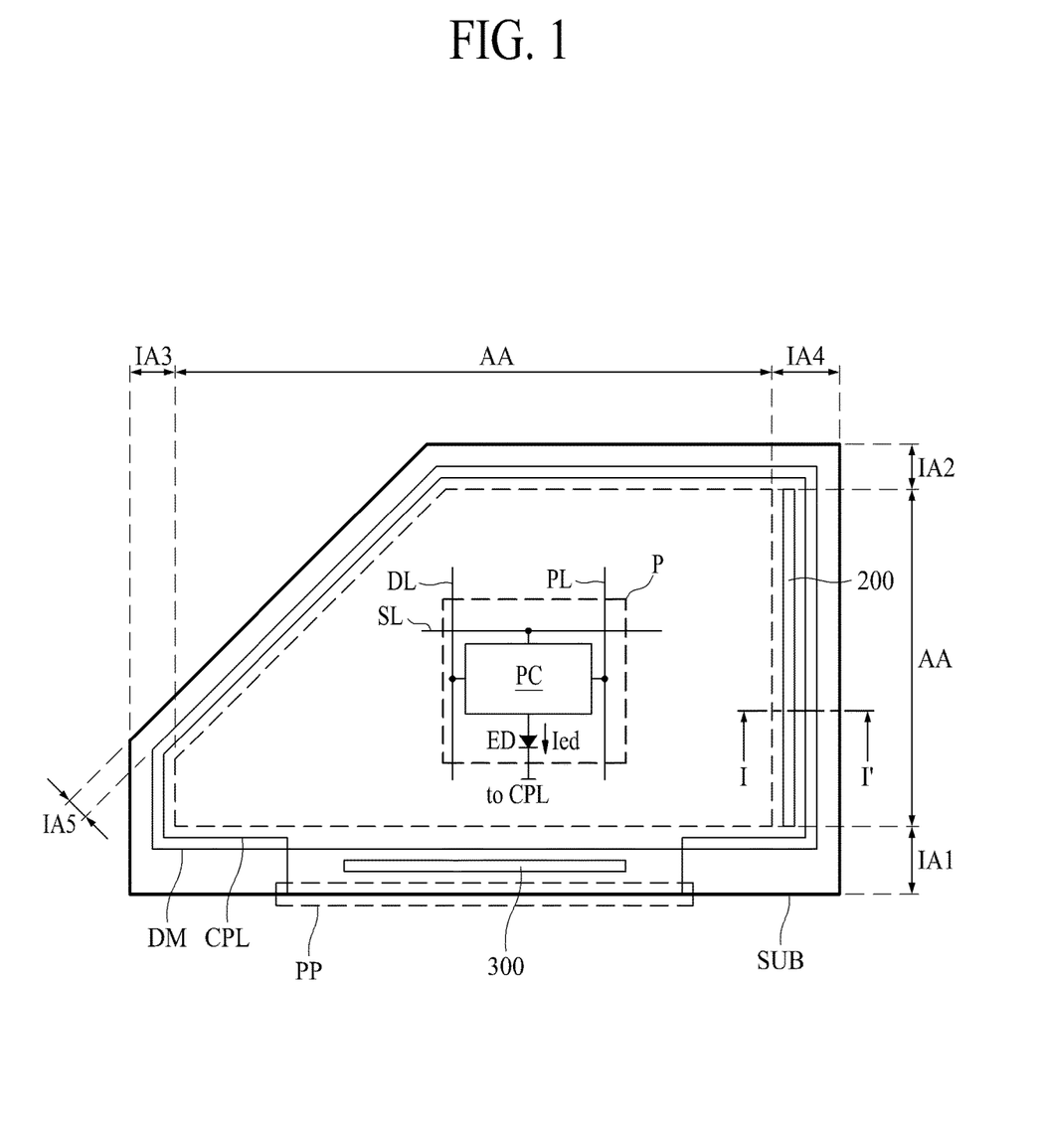
FIG. 1 is a plan view illustrating a free-form electroluminescence display according an embodiment of the present disclosure.

FIG. 1 is a plan view illustrating a free-form electroluminescence display according an embodiment of the present disclosure. Referring to FIG. 1, a free-form electroluminescence display will be explained. Referring to FIG. 1, a free-form electroluminescence display according to an embodiment of the present disclosure may have any free shape. In one or more embodiments, the various free shapes will not include rectangular shapes. However, in some embodiments, the free-form electroluminescence display of the present disclosure may also be applied to rectangular shapes. The free-from electroluminescence display according to an embodiment of the present disclosure comprises a substrate SUB, a pixel P, a common power line CPL, a dam DM and drivers PP, 200 and 300.

The substrate SUB, as a base substrate or a base layer, may include a plastic material or a glass material. For example, in the case of a flexible display, the substrate SUB may be made of a plastic material having a superior flexibility, pliability. Even though using a glass material, the flexible display may be acquired by thinning the glass substrate in a high degree. By thinning the glass substrate, the glass material may also have flexibility and pliability.

For example, the substrate SUB may have a non-rectangular shape such as a triangular shape, a pentagonal shape, a circular shape or an elliptical shape. As shown in FIG. 1, the substrate SUB according to an embodiment may have an asymmetric pentagonal shape in which one corner part, for example the upper left corner in FIG. 1, is removed from a rectangular shape.

The substrate SUB may include a display area AA a non-display area IA. The display area AA may be defined as an area for displaying the video data, image data that is in the most central areas of the substrate SUB. In this embodiment, the display area AA may have an asymmetric pentagonal shape as seen from a plan view.

The non-display area IA surrounding the display area AA at the circumference areas of the substrate SUB may be defined as the area where the video data, image data is not displayed or the peripheral elements are disposed. The non-display area IA may include a first non-display area IA1 at the first side of the substrate SUB, a second non-display area IA2 parallel and opposite to the first non-display area IA1at the second side of the substrate SUB, a third non-display area IA3 at the third side of the substrate SUB, a fourth non-display area IA4 parallel and opposite to the third non-display area IA3 at the fourth side of the substrate SUB, and a fifth non-display area IA5 at the diagonal side connecting the second (or upper) side and the third (or lest) side of the substrate SUB. For example, the first non-display area IA1 may be disposed at the upper (or lower) circumferential area, the second non-display area IA2 may be disposed at the lower (or upper) circumferential area, the third non-display area IA3 may be disposed at the left (or right) circumferential area, the fourth non-display area IA4 may be disposed at the right (or left) circumferential area, and the fifth non-display area IA5 may be disposed at the diagonal circumferential area.

The pixel P may be disposed within the display area AA on the substrate SUB. For example, a plurality of pixels P may be disposed in a matrix manner and they may be arranged to form an array of pixels within the display area AA. The pixel P may be formed adjacent to a scan line SL, a data line DL and a pixel driving power line PL.

The scan line SL may run along to a first direction and a plurality of the scan lines SL may be arrayed with a predetermined distance from each other along to a second direction crossing the first direction. The display area AA may have a plurality of the scan lines SL parallel to the first direction and apart from each other along to the second direction. Here, the first direction may be defined as a horizontal direction of the substrate SUB and the second direction may be defined as a vertical direction of the substrate SUB, but it is not restricted thereto.

The data line DL may run along to the second direction and a plurality of the data lines DL may be arrayed with a predetermined distance from each other along to the first direction. The display area AA of the substrate SUB may have a plurality of the data lines DL parallel to the second direction and apart from each other along to the first direction.

The pixel driving power line PL may be disposed as being parallel to the data line DL. The display area AA of the substrate SUB may have a plurality of the pixel driving power line PL parallel to the data line DL. In another case, the pixel driving power line PL may be disposed as being parallel to the scan line SL.

The pixels P may be arrayed as being a stripe structure within the display area AA. In this case, one unit pixel may include a red subpixel, a green subpixel and a blue subpixel. In another case, one unit pixel may further include a white subpixel.

For another cases, the pixels P may be arrayed in a tile pattern structure within the display area AA. In this case, one unit pixel may include a red subpixel, at least two green subpixels and a blue subpixel disposed in a polygon layout, for example in an octagon layout. In this case, the blue subpixel may have the largest aperture size (or emission size) and the green subpixel may have the smallest aperture size. For example, a PenTile structure may also be used.

The pixel P may include a pixel circuit PC electrically connected to the scan line SL, the data line DL and the pixel driving power line PL, and an emission element ED electrically connected to the pixel circuit PC.

The pixel circuit PC may control the electric current Ied supplying to the emission element ED from the pixel driving power line PL based on the data voltage provided from the data line DL responding to the scan signal provided from the scan line SL.

The pixel circuit PC may have at least two thin film transistors and one capacitor. In an example, the pixel circuit PC may have a driving thin film transistor supplying the data current Ied to the emission element ED based on the data voltage, a switching thin film transistor supplying the data voltage from the data line DL to the driving thin film transistor, and a capacitor storing the capacitance corresponding to the voltage differences between the gate and the source of the driving thin film transistor.

For another case, the pixel circuit PC may include at least three thin film transistors and one capacitor. For example, the pixel driving circuit PC may include a current supplying circuit, a data supplying circuit and a compensation circuit according to the operations (or function) of these three thin film transistors. Here, the current supplying circuit may include a driving thin film transistor supplying the data current Ied based on the data voltage to the emission element ED. The data supplying circuit may include at least one switching thin film transistor supplying the data voltage from the data line DL responding to the scan signal to the current supplying circuit. The compensation circuit may include at least one compensation thin film transistor compensating the variations of the characteristics (the threshold voltage, the electron mobility, or both) of the driving thin film transistor responding to the scan signal.

The emission element ED may emit the lights having the brightness corresponding to the data current Ied supplied from the pixel circuit PC. The data current Ied may flow from the pixel driving power line PL to the common power line CPL via the driving thin film transistor and the emission element ED sequentially.

The emission element ED may include a pixel driving electrode (or first electrode or anode electrode) electrically connected to the pixel circuit PC, an emission layer formed on the pixel driving electrode and a common electrode (or second electrode or cathode electrode) CE electrically connected to the emission layer.

The common power line CPL may be disposed at the non-display area IA of the substrate SUB, and electrically connected to the common electrode CE disposed in the display area AA. For example, the common power line CPL may have a width and be disposed from the one side of the first non-display area IA1 to the other side of the first non-display area IA1 by passing the second to the fifth non-display areas IA2, IA3, IA4 and IA5 as surrounding the display area AA excepting the middle portion of the first non-display area IA1. Therefore, the common power line CPL may have the 'n' shape of which one side corresponding to the first non-display area IA1 is opened.

An encapsulation layer (not shown) may be disposed on the substrate SUB as completely covering the upper surface and the side surfaces of the display area AA and the common power line CPL. In one embodiment, the encapsulation layer may not cover one end and other end of the common power line CPL at the first non-display area IA1. The encapsulation layer is for preventing oxygen or moisture or other external, foreign materials from penetrating into the emission element ED arrayed within the display area AA. For one example, the encapsulation layer may include at least one inorganic layer. For another example, the encapsulation layer may include a plurality of inorganic layers and the organic layer between the inorganic layers. Other configurations of the encapsulation layer may be possible.

An electroluminescence display according to one embodiment of the present disclosure may comprise a pad portion PP, a gate driver 200 and a driving integrated circuit 300.

The pad portion PP may include a plurality of pads disposed in the non-display area IA. For example, the pad portion PP include a plurality of common power supplying pad disposed in the first non-display area IA1, a plurality of data input pads, a plurality of power supplying pads and a plurality of control signal input pads.

The gate driver 200 is disposed at the fourth non-display area IA4 of the substrate SUB and connected to the scan lines SL disposed in the display area AA. The gate driver 200 may simultaneously formed in the fourth non-display area IA4 as forming the thin film transistor in the display area AA. The gate driver 200 may drive each of the scan lines SL sequentially by generating and outputting the scan signal based on the gate control signal supplied from the driving integrated circuit 300. For an example, the gate driver 200 may include a shift register.

The dam DM may have a closed curve surrounding the display area AA as disposed at the first non-display area IA1, the second non-display area IA2, the third non-display area IA3, the fourth non-display area IA4 and the fifth non-display area IA5. For example, because the dam DM is disposed outside of the common power line CPL, the dam DM may be located at the outermost area on the substrate SUB. The pad portion PP and the driving integrated circuit may be disposed outside of the dam DM.

FIG. 1 shows the case in which the dam DM is disposed at the outermost area of the substrate SUB, but it is not restricted thereto. For another example, the dam DM may be disposed between the common power line CPL and the gate driver 200. For another example, the dam DM may be disposed between the display area AA and the gate driver 200.

The driving integrated circuit 300 is disposed on the chip mounting area defined at the first non-display area IA1 of the substrate SUB using the chip mounting (or bonding) process. The input terminals of the driving integrated circuit 300 may be electrically connected to the pad portion PP and the output terminals of the driving integrated circuit 300 may be electrically connected to the data lines DL and the pixel driving power lines PL. The driving integrated circuit 300 receives the power signal, the timing synchronizing signal and the digital video, image data supplied from the display driver (or host circuit) via the pad portion PP. The driving integrated circuit 300 generates the gate control signals according to the timing synchronizing signal to operate the gate driver 200, and then converts the digital video, image data to the analog pixel data voltages and supplies them to the data lines DL.

Figure 2:
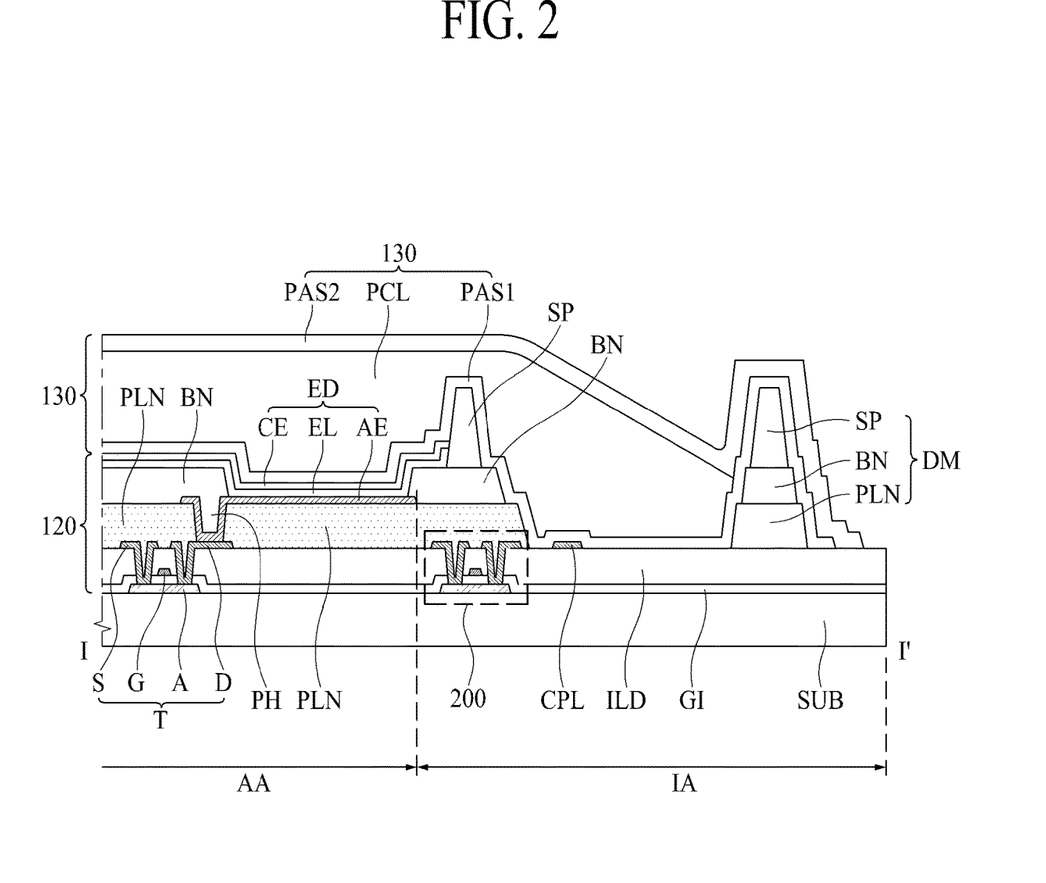
FIG. 2 is a cross-sectional view, along to cutting line I-I' in FIG. 1, illustrating a structure of a free-form electroluminescence display according to an embodiment of the present disclosure.

FIG. 2 is a cross-sectional view, along to cutting line I-I' in FIG. 1, illustrating a structure of a free-form electroluminescence display according to an embodiment of the present disclosure. Further referring to FIG. 2, the various embodiments of the present disclosure will be explained.

A free-form electroluminescence display may comprise a substrate SUB, a pixel array layer 120, a spacer SP and an encapsulation layer 130.

The substrate SUB as a base layer may be made of the plastic material or the glass material. The substrate SUB may include an opaque or a colored polyimide material. For example, the substrate SUB of the polyimide may be a hardened polyimide resin layer which is coated with a predetermined thickness on a release layer disposed on a front surface of the carrier glass substrate relatively thicker than the polyimide substrate SUB. In this case, the carrier glass substrate and the substrate SUB of the polyimide may be separated from each other by the release process using laser. In that case, the substrate SUB may further include a back plate attached on the rear surface of the substrate SUB in the thickness direction. The back plate is for sustaining the substrate SUB in a flat plane condition. For example, the back plate may include a plastic material such as the polyethylene terephthalate material. The back plate may be laminated at the rear surface of the substrate SUB released from the carrier glass substrate.

In an embodiment where the substrate SUB is a glass substrate, the glass substrate SUB may be a thin glass substrate having a thickness less than about 100 micrometers. In another embodiment where the glass substrate SUB is a carrier glass substrate, the carrier glass substrate may have a thickness that is etched to be less than about 100 micrometers.

On the upper surface of the substrate SUB, a buffer layer (not shown) may be disposed. For preventing the moisture or other external, foreign materials from penetrating into the pixel array layer 120 through the substrate SUB, the buffer layer may be deposited on the upper surface of the substrate SUB. The buffer layer may include a plurality of the inorganic layers. For example, the buffer layer may include a plurality of layers of the silicon oxidation (SiOx) layer, the silicon nitride (SiNx) layer and the silicon nitro-oxidation (SiON) layer is alternatively stacked. The buffer layer may be omitted in some cases.

The pixel array layer 120 may include a thin film transistor layer, a planarization layer PLN, a bank BN and an emission element.

The thin film transistor layer may be formed at the display area AA where the pixels P are disposed and at the gate driver 200 located at the fourth non-display area IA4 of the substrate SUB.

For example, the thin film transistor layer may include a thin film transistor T, a gate insulating layer GI and an intermediate insulating layer ILD. Here, the thin film transistor T shown in FIG. 2 may be a driving thin film transistor electrically connected to the emission element ED.

Figure 3:
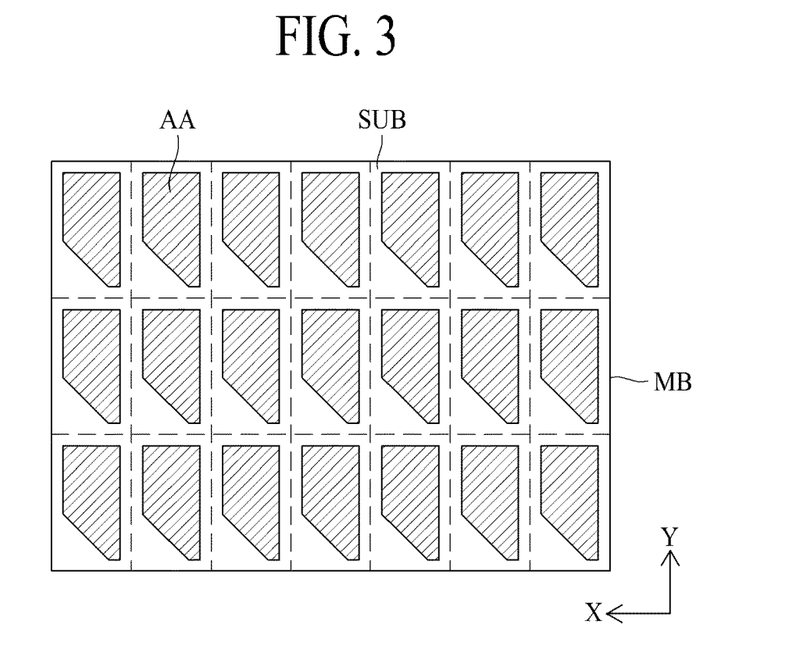
FIG. 3 is a plan view illustrating a mother substrate having a plurality of free-form display panel according to an embodiment of the present disclosure.

The thin film transistor T may include a semiconductor layer A disposed on the substrate SUB or the buffer layer, a gate electrode G, a source electrode S and a drain electrode D. In FIG. 3, the thin film transistor T has the top gate structure in which the gate electrode G is disposed over the semiconductor layer A, but it is not restricted thereof. For another example, the thin film transistor T may have the bottom gate structure in which the gate electrode G is disposed under the semiconductor layer A. Otherwise, the thin film transistor T may have the double gate structure in which the upper and bottom gate electrodes G are disposed at upper and bottom sides of the semiconductor layer A, respectively.

The semiconductor layer A may be formed on the substrate SUB or the buffer layer. The semiconductor layer A may include a silicon type semiconductor material, an oxidation semiconductor material or an organic semiconductor material, and may have a single layer structure or a multi-layer structure. Between the buffer layer and the semiconductor layer A, a light shielding layer may be further included to block the external light into the semiconductor A.

The gate insulating layer GI may be deposited on the substrate as covering the semiconductors A. The gate insulating layer GI may include an inorganic layer such as a silicon oxidation (SiOx) layer, a silicon nitride layer (SiNx) and a multi-layer thereof.

The gate electrode G may be formed on the gate insulating layer GI as overlapping with the semiconductor layer A. The gate electrode G may be formed with the scan line SL. For example, the gate electrode G may be formed as the single layer or the multiple layer including the molybdenum (MO), the aluminum (Al), the chrome (Cr), the gold (Au), the titanium (Ti), the nickel (Ni), the neodymium (Nd) or copper (Cu) or alloy thereof.

The intermediate insulating layer ILD may be deposited on the substrate SUB as covering the gate electrode G and the gate insulating layer GI. The intermediate insulating layer ILD may provide the flat surface on the substrate having the gate electrode G and the gate insulating layer GI.

The source electrode S and the drain electrode D are formed on the intermediate insulating layer ILD as connecting to the one side and the other side of the semiconductor layer, respectively. The source electrode S and the drain electrode D may be formed with the data line DL, the pixel driving power line PL and the common power line CPL. For example, the source electrode S, the drain electrode D, the data line DL, the pixel driving power line PL and the common power line CPL are simultaneously formed by the patterning process after coating the source-drain material thin layer.

The source electrode S and the drain electrode D are connected to the semiconductor layer A through the contact holes penetrating the intermediate insulating layer ILD and the gate insulating layer GI, respectively. The source electrode S and the drain electrode D may be formed as the single layer or the multiple layer including the molybdenum (Mo), the aluminum (Al), the chrome (Cr), the gold (Au), the titanium (Ti), the nickel (Ni), the neodymium (Nd) or copper (Cu) or alloy thereof. Here, the source electrode S of the thin film transistor T shown in FIG. 3 may be electrically connected to the pixel driving power line PL.

The thin film transistor T disposed at the pixel P of the substrate SUB may be included in the pixel circuit PC. The gate driver 200 disposed at the fourth non-display area IA4 of the substrate SUB may include the thin film transistors that is substantially the same with or similar with the thin film transistor T disposed in the pixel P.

The planarization layer PLN may be deposited on the whole surface of the substrate SUB as covering the thin film transistor layer. The planarization layer PLN provides a flat surface condition over the thin film transistor layer. For example, the planarization layer PLN may be made of the organic layer such as the acryl resin, the epoxy resin, the phenolic resin, the polyamide resin or the polyimide resin.

For another example, the planarization layer PLN may include a pixel contact hole PH for exposing some of the drain electrode D of the thin film transistor T disposed in the pixel P.

Disposed on the planarization layer PLN, the bank BN may define the aperture area (or emission area) within the pixel P of the display area AA. The bank BN may be called as a pixel definition layer.

The emission element ED may include a pixel driving electrode AE, an emission layer EL and a common electrode CE. The pixel driving electrode AE may be formed on the planarization layer PLN, and electrically connected to the drain electrode D of the driving thin film transistor through the pixel contact hole PH formed at the planarization layer PLN. In this case, the bank BN may cover the circumferential portions of the pixel driving electrode AE excepting the middle portions of pixel driving electrode AE overlapping with the aperture area of the pixel P. The bank BN may define the aperture area by covering the circumferential portions of the pixel driving electrode AE.

The pixel driving electrode AE may include a metal material having relatively high reflective index. For example, the pixel driving electrode AE may have a multi-layer structure such as a stacked structure (Ti/Al/Ti) of the aluminum (Al) and the titanium (Ti), a stacked structure (ITO/Al/ITO) of the aluminum (Al) and the ITO (Indium Thin Oxide), the APC (Ag/Pd/Cu) alloy and a stacked structure (ITO/APC/ITO) of ACP alloy and the ITO, or a single layer structure including at least selected one of silver (Ag), aluminum (Al), molybdenum (Mo), gold (Au), magnesium (Mg), calcium (Ca) or barium (Ba). Other structure can be utilized and the present disclosure is not limited to the aforementioned structures.

The emission layer EL may be deposited on the display area AA of the substrate SUB as covering the pixel driving electrode AE and the bank BN. The emission layer EL may include at least two emission portions vertically stacked in order to emit the white color light. For example, the emission layer EL may include a first emission portion and a second emission portion in order to emit the white color light by combining a first light from the first emission portion and a second light from the second emission portion. Here, the first emission portion for emitting the first light may include a blue emission portion, a green emission portion, a red emission portion, a yellow emission portion and a yellowish green emission portion. The second emission portion may include any selected one of a blue emission layer, a green emission layer, a red emission layer, a yellow emission layer and a yellowish green emission layer for emitting the second light which can optically compensate the first light.

For another embodiment, the emission layer EL may include any one of the blue emission layer, the green emission layer and the red emission layer in order to emit the color light corresponding to the specified color light to the pixel P. For example, the emission layer EL may include any one of the organic emission layer, the inorganic emission layer and a quantum dot emission layer, a stacked layer of the organic emission layer (or inorganic emission layer) and the quantum dot emission layer, or any combination structure thereof.

In addition, the emission element ED may further include a functional layer for enhancing the light emitting efficiency, the life time of the emission layer EL.

The common electrode CE may electrically connected to the emission layer EL. The common electrode CE may be formed on the display area AA of the substrate SUB as commonly connecting to the emission layer EL disposed at the pixel P.

For example, the common electrode CE may have a transparent conductive material or a semi-transparent conductive material. In the case that the common electrode CE has the semi-transparent conductive material, the microcavity structure may be applied to enhance the emission efficiency of the emission element ED. In one example, the semi-transparent conductive material may be selected one of magnesium (Mg), silver (Ag) and an alloy of the magnesium (Mg) and silver (Ag). On the common electrode CE, a capping layer may be further formed for enhancing the light emission efficiency by controlling the refractive index of the light emitted from the emission element ED.

The spacer SP may be disposed at any location within the substrate SUB. However, in some embodiments, the spacer SP may not be located at the aperture area having the emission elements ED in the display area AA. As shown in FIG. 2, the spacer SP may be disposed on the bank BN. The spacer SP may be the element for preventing the screen mask from contacting on the substrate directly during the deposition process of the emission layer EL. As the spacer SP is disposed on the bank BN and has the tapered shape, the emission layer EL and the common electrode CE may be deposited as following and covering the whole surfaces of the spacer SP disposed within the display area AA.

In some cases, the emission layer EL, the common electrode CE may not be deposited on the spacer SP. For example, the emission layer EL, the common electrode CE is not deposited along the shape of the spacer SP in FIG. 2. However, as explained previously, the spacer SP may be disposed on some area of the bank BN within the display area AA. Even though the common electrode CE is not deposited on or over the spacer SP and appears to be disconnected at some portions, nevertheless the common electrode CE is electrically connected along the entire surface of the display area AA.

The encapsulation layer 130 may be formed on the upper surface and the side surface of the pixel array layer 120. In some examples, the encapsulation layer 130 may cover the upper surface and the side surface of the pixel array layer 120. The encapsulation layer 130 has the function for preventing the oxygen or moisture from penetrating into the emission element ED.

For one embodiment, the encapsulation layer 130 may include a first inorganic layer PAS1, an organic layer PCL on the first inorganic layer and a second inorganic layer PAS2 on the organic layer PCL. The first inorganic layer PAS1 and the second inorganic layer PAS2 may play the role for preventing the moisture or the oxygen from penetrating there-into. For example, the first inorganic layer PAS1 and the second inorganic layer PAS2 may include an inorganic material such as the silicon nitride, the aluminum nitride, the zirconium nitride, the titanium nitride, the hafnium nitride, the tantalum nitride, the silicon oxide, the aluminum oxide or the titanium oxide. The first inorganic layer PAS1 and the second inorganic layer PAS2 may be formed by the chemical vapor deposition process or the atomic layer deposition process.

The organic layer PCL may be surrounded by the first inorganic layer PAS1 and the second inorganic layer PAS2. For adhering and/or blocking the particles which may be generated during the manufacturing process, the organic layer PCL may have the thickness relatively thicker than those of the first inorganic layer PAS1 and second inorganic layer PAS2. The organic layer PCL may have an organic material such as a silicon oxy-carbon (SiOC$_z$) acryl or a resin of epoxy family. The organic layer PCL may be formed by the coating process such as the ink-jet coating process or the slit coating process.

A free-form electroluminescence display according to an embodiment of the present disclosure may further include a dam DM. The dam DM may be disposed at the non-display area IA for preventing the organic layer PCL from overflowing over the outside of the display.

The dam DM may be disposed outside of the common power line CPL surrounding the display area AA and the gate driver 200 being outside of the display area AA. In some cases, the dam DM may be disposed as overlapping with outer portions of the common power line CPL. In these cases, the width of the non-display area IA, e.g., the bezel area, having the gate driver 200 and the common power line CPL can be reduced.

The dam DM according to one embodiment of the present disclosure may have a three-layered structure in the vertical direction. For example, the dam DM may include a first layer made of the planarization layer PLN, a second layer made of the bank BN, and a third layer made of the spacer SP.

The first layer may have a trapezoid cross-sectional shape as patterning the planarization layer PLN. The second layer may have the trapezoid cross-sectional shape continuously stacked on the first layer. The third layer also may have the trapezoid cross-sectional shape. In the case that it is easy to control the expansion of the organic layer PCL because its thickness is thin, the dam DM should not be high. In this case, the third layer may be omitted. In other embodiments, the third layer, spacer SP, may have a triangular cross-sectional shape.

The dam DM may be covered by the first inorganic layer PAS1 and/or the second inorganic layer PAS2. The organic layer PCL may contact some of the inner side surface of the dam DM. For one example, the height up to the upper surface of the organic layer PCL at the outer most area may be higher than the first layer but lower than the second layer. For another example, the height up to the upper surface of the organic layer PCL at the outer most area may be higher than the second layer but lower than the third layer.

The height up to the upper surface of the organic layer PCL at the outer most area preferably is lower than the whole height of the dam DM. Therefore, at the upper surface and the outer side surface of the dam DM, the first inorganic layer PAS1 and the second inorganic layer PAS2 may be contacting each other at the surface.

When manufacturing the free-form electroluminescence display explained above, one substrate SUB may be used for one display. However, for ensuring the efficiency of the manufacturing yield, a plurality of free-form electroluminescence display may be formed on one large mother substrate and then they may be separated from each other by cutting each display substrate. For example, as shown in FIG. 3, allocating a plurality of unit substrate SUB on one mother substrate MB, forming the display elements on the every unit substrate SUB, separating each of the unit substrate SUB, and then conducting post other processes, a plurality of free-form electroluminescence displays may be formed.

Figure 4:
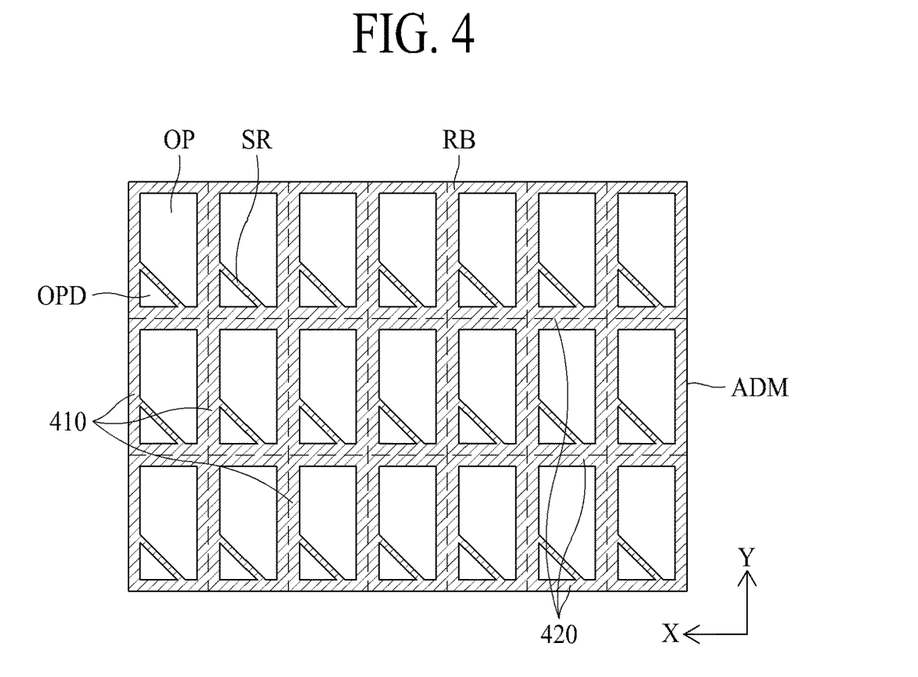
FIG. 4 is a plan view illustrating a structure of a mask for the free-form display according to an embodiment of the present disclosure.

FIG. 3 is a plan view illustrating a mother substrate having a plurality of free-form display panel according to an embodiment of the present disclosure. In order that the elements are formed at the display area AA allocated at each unit substrate SUB arrayed on the mother substrate MB as shown in FIG. 3, a mask ADM having a plurality of apertures OP corresponding to the display areas AA of each unit substrate SUB, as shown in FIG. 4. FIG. 4 is a plan view illustrating a structure of a mask, e.g., active area define mask, for the free-form display according to an embodiment of the present disclosure.

The mask may be used for depositing an organic layer under the high temperature condition instead of the room temperature. For example, the mask may be formed of the invar material. When an electroplating instrument is used for coating the invar material to a metal frame, the plating solution may be a complex solution including a nickel ion source such as a nickel sulfate ($NiSO_4$) anhydride or a nickel chloride ($NiCl_2$), an iron ion source such as a ferrous sulfate ($FeSO_4$) anhydride, a pH adjusting agent such as a boric acid, a polishing agent, a stress relaxation agent, a stabilizing agent. But it is not restricted thereto. In this disclosure, the plating layer may be the invar material, but it is not restricted thereto.

Referring to FIG. 4, a mask ADM for a free-from electroluminescence display according to an embodiment of the present disclosure may include an aperture OP, a rib RB, a dummy aperture OPD and a sub rib SR. The mask ADM may have substantially the same shape and size corresponding to the mother substrate MB. The shape and size of the aperture OP corresponds to the display area AA of the unit substrate SUB. Therefore, the aperture OP may have a rectangular portion and a non-rectangular portion, like the display area AA. The rib RB surrounds the rectangular portion of the aperture OP. As shown in FIG. 4, in one embodiment, the rib RB has a net shape or a mesh shape. The rib RB includes a plurality of first rib members 410 in a first direction and a plurality of second rib members 420 in a second direction. The first direction and the second direction are transverse to each other. For example, the first direction may be a direction along the y-axis, and the second direction may be a direction along the x-axis. However, the first direction and the second direction do not necessarily have to be perpendicular to each other and other angles (e.g., acute, obtuse angles) may be employed to implement the mask ADM. The aperture OP is formed as a result of the space made by the plurality of first rib members 410 and the plurality of second rib members 420. The dummy aperture OPD may be disposed adjacent to the non-rectangular portion of the aperture OP. The sub rib SR is disposed between the aperture OP and the dummy aperture OPD. In one embodiment, a sub rib SR is connected to a first rib member 410 and a second rib member 420 so as to spatially divide the aperture OP and the dummy aperture OPD. As the mother substrate MB has a plurality of the unit substrates SUB with a predetermined distance, the mask ADM may have a plurality of apertures OP with the predetermined distance. Between two rectangular portions of the two neighboring apertures OP, one rib RB is disposed. At one non-rectangular portion of the aperture OP, the dummy aperture OPD is disposed so that the sum of the aperture OP and the dummy aperture OPD may form a rectangular shape. Between the aperture OP and the dummy aperture OPD which are forming one rectangular shape, the sub rib SR is disposed. Between the dummy aperture OPD and other aperture OP which are not forming one rectangular shape, the rib RB is disposed. The sub rib SR may have a width same as or similar with the width of the rib RB. However, other shape and width may be used for the sub rib SR and the rib RB.

Without the dummy aperture OPD, the rib RB between two neighboring aperture OP does not have same or similar width. For example, between two neighboring rectangular portions a narrow width is formed, but a wide width is formed at the non-rectangular portion. When a mask ADM without dummy aperture OPD is mounted on the mother substrate MB, the non-rectangular portion having the wide width may be sagged down. This may cause unevenness on the thickness or the shape distortion of the deposited an organic material for forming an emitting layer.

The main reason for this problem is the wide width portion of the rib RB due to the non-rectangular shape of the aperture OP. By forming the dummy aperture OPD at the wide width portion, the sub rib SR is formed between the dummy aperture OPD and the aperture OP. For one example, the sub rib SR may have substantially the same width as the width of the rib RB. For another example, the sub rib SR may have the width slightly narrower than the width of the rib RB.

For the case shown in FIG. 4, the sub rib SR may run in diagonal direction between two ribs RB. When a tensile force is applied to the mask ADM to sustain its flat surface near the surface of the mother substrate MB, the sub rib SR may be applied with the tensile force less than rib RB. When the sub rib SR with less tensile force may have the same width as the rib RB with more tensile force, the sub rib SR may be excessively pulled, so that the sub rib SR may be distorted or soared up. This may cause any distortion to the shape or thickness of the deposited organic layer on the mother substrate MB using the mask ADM. To prevent this problem, it is preferable that the sub rib SR has a narrower width than that of the rib RB.

In some cases, the width of the sub rib SR may have a wider width than that of the rib RB. The width condition of the sub rib SR may be dependent of the shape or size of the dummy aperture OPD. In addition, the relationship between the width of the sub rib SR and the width of the rib RB may not be fixed but be determined as considering the size and thickness of the mask ADM and the tensile force of the instrument for mounting the mask ADM.

Figure 5:
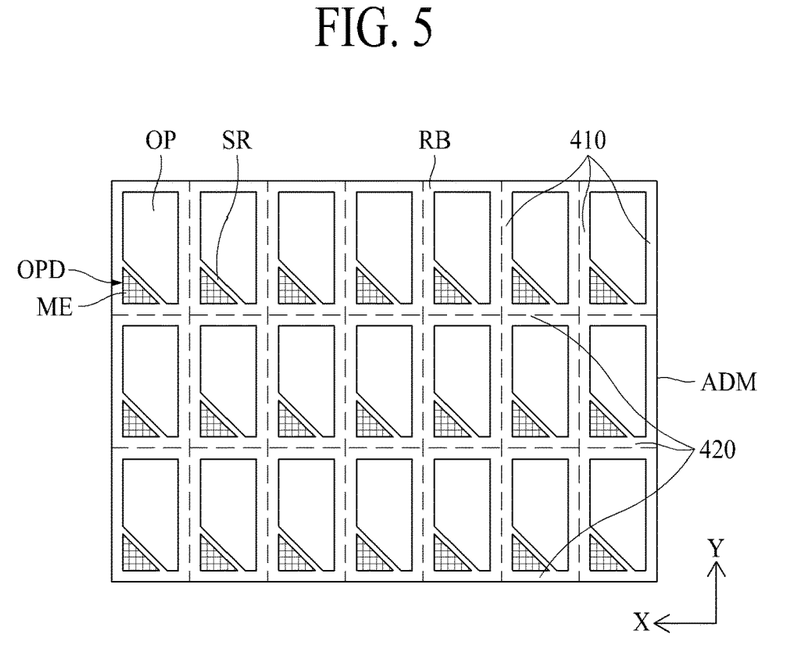
FIG. 5 is a plan view illustrating a structure of a mask for the free-form display according to another embodiment of the present disclosure.

Hereinafter, referring to FIG. 5, a free-form electroluminescence display according to another embodiment of the present disclosure will be explained. FIG. 5 is a plan view illustrating a structure of a mask for the free-form display according to another embodiment of the present disclosure.

The aperture OP is the opened area corresponding to the display area AA of the unit substrate SUB. The rib RB is the portion of the mask ADM disposed between two neighboring aperture OP. The dummy aperture OPD is additionally opened area for forming the sub rib SR having similar width as the rib RB by removing some area the wider portion of the rib RB due to the non-rectangular portion of the aperture OP.

In another embodiment of the present disclosure, the mask ADM may further include a mesh structure ME at the dummy aperture OPD. The mesh structure ME may be a grid or lattice pattern formed at the dummy aperture OPD. For example, the mesh structure ME may be a plurality of fine ribs linking the rib RB and the sub rib SR.

Referring to the free-form electroluminescence display shown in FIG. 4, the mask ADM has the sub rib SR running to diagonal direction, so that wider portion of the rib RB can be removed to keep the tensile force evenly over the entire area of the mask ADM. Further, as controlling the width of the sub rib SR, the tensile force applied to the sub rib SR can be adjusted to be similar or the same as the tensile force to the rib RB.

The ribs RB are disposed along to the horizontal direction and the vertical direction, while the sub ribs SR are disposed along to the diagonal direction. Therefore, as the tensile force is applied in the vector decomposition direction on the plan of the mask ADM, the distortions, soaring or sagging, of the mask ADM may still be remained. For example, when applying the magnetic field to the mask ADM, there may be a time difference between the time for settling (or sticking) the sub rib SR on the mother substrate MB and the time for settling the rib RB to the mother substrate MB. In this case, the soaring or sagging may be occurred at the rib RB, or the sub rib SR, or both ribs RB, SR. This may cause the distortion of the deposition results of the organic layer.

In order to prevent these problems, the mesh structure ME may be further disposed within the dummy aperture OPD. The mesh structure ME may have a plurality of fine ribs for linking the rib RB and the sub rib SR which are surrounding the dummy aperture OP. As applying the tensile force by the magnetic field, there is no difference or delay between the settling time of the rib RB on the mother substrate MB and the settling time of sub rib SR on the mother substrate MB.

Figure 6:
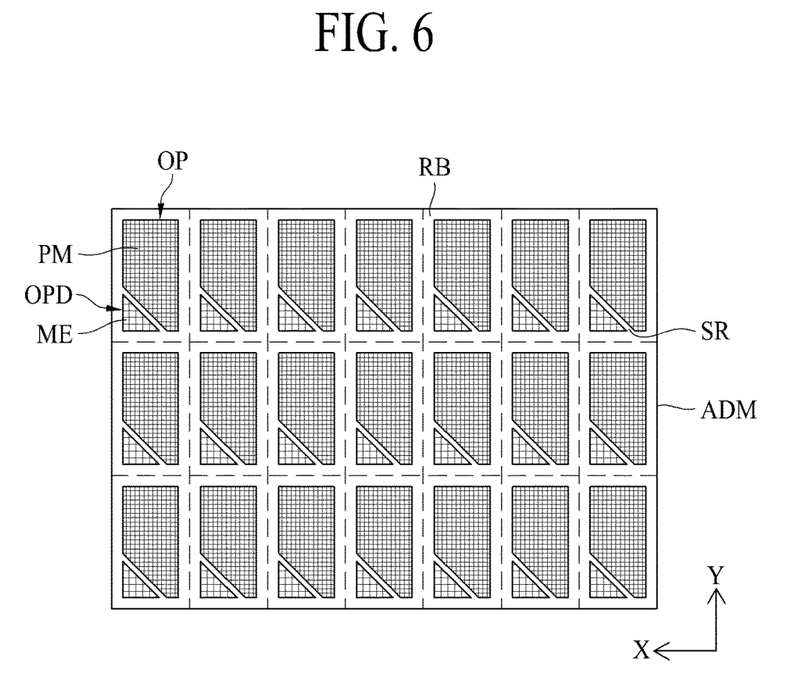
FIG. 6 is a plan view illustrating a structure of a mask for the free-form display according to another embodiment of the present disclosure.

FIG. 6 is a plan view illustrating a structure of a mask for the free-form display according to yet another embodiment of the present disclosure. Another embodiment of the present disclosure will be explained with reference to FIG. 6.

Referring to FIG. 6, a mask ADM for a free-form electroluminescence display may have the very similar shape with the mask shown in FIG. 5. The mask ADM according to the embodiment shown in FIG. 6 may further include a pixel pattern PM within the aperture OP. The pixel pattern PM may be a mask pattern for the case in which the different color light emission layer is disposed at each of the sub pixel, respectively. For example, a first mask may include a plurality of apertures OP corresponding to the red sub pixels only. A second mask may include a plurality of apertures OP corresponding to the blue sub pixels only. A third mask may include a plurality of apertures OP corresponding to the green sub pixel only.

Using three different masks, the different color emission layers are deposited on the red sub pixels, the blue sub pixels and the green sub pixels, respectively. In this case, the pixel pattern PM may have much more fine ribs and much less openings than the mesh structure ME. Dependent on the cases, an additional mask having the pixel pattern PM may be prepared and then it may be overlaid with the mask ADM for the free-form electroluminescence display. This case will be explained in connection with FIG. 7 below.

Figure 7:
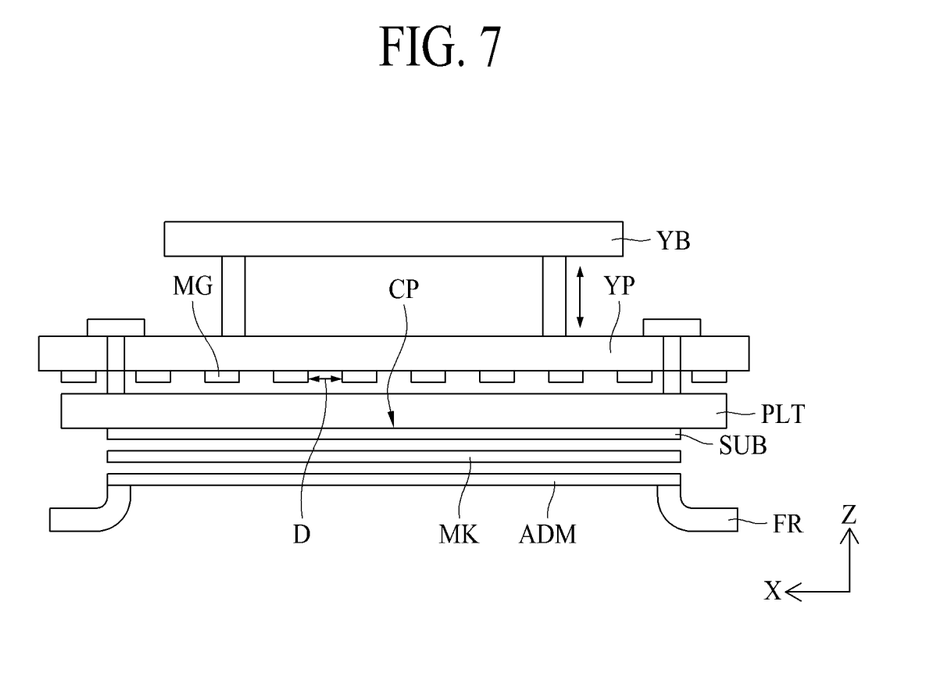
FIG. 7 is a diagram illustrating a manufacturing equipment having a mask for a free-form display according to an embodiment of the present disclosure.

FIG. 7 is a diagram illustrating a manufacturing equipment having a mask for a free-form display according to an embodiment of the present disclosure.

Referring to FIG. 7, the equipment or instrument for depositing the emission layer for electroluminescence display may comprise a yoke plate YP, a yoke driver YD, a magnet MG, a mounting plate PLT and a mask frame FR. The yoke plate YP may move up and down by the yoke driver YB. The magnet MG may be disposed under the yoke plate YP. The mounting plate PLT is a plate for installing the mother substrate MB there-under. For example, by applying an electrostatic force on the lower surface of the mounting plate PLT, the mother substrate MB can be attached on the lower surface of the mounting plate PLT. In this case, the equipment may further include device for supplying and removing the electrostatic to the mounting plate PLT. The mask frame FR may be a frame for mounting the mask ADM for the free-form electroluminescence display.

At first, the mask ADM for the free-form electroluminescence display is mounted on the mask frame FR. When the mother substrate MB is very large, the mask ADM may be sagged down, so that it is preferable that the mask ADM may be fixed on the mask frame FR by welding to maintain its flatness. In some cases, the pixel mask MK may be further mounted on the mask ADM for the free-form electroluminescence display. The pixel mask MK is the mask for depositing the different color emission layers at each of the sub pixel arrayed in the display area AA. For example, the pixel pattern PM as shown in FIG. 6 will be obtained by use of a pixel mask MK that may be a specific mask having the desired pixel pattern PM. Therefore, when depositing the red, the blue and the green emission layers, the three of the pixel mask MK may be required.

Next, the mother substrate MB is equipped to the mounting plate PLT. The mounting plate PLT having the mother substrate MB is installed to the yoke plate YP. Lowering down the yoke plate YP, the mask ADM is mounted under the mother substrate MB as having a predetermined distance there-between. Here, when the mother substrate MB has very large areas, the middle portions of the mask ADM may be sagged down so that the flatness of the mask ADM may not be maintained. In order to compensate the sagging, the mask ADM for the free-form electroluminescence display may be closely disposed with the flatness by driving the magnet MG. Therefore, it is preferable that the free-form electroluminescence display include a magnetic material actively responding to the magnet MG.

When the pulling force by the magnet MG is applied to the rib RB, without the dummy aperture OPD, the pulling force may be excessively focused on the area where the dummy aperture OPD would be formed. As a result, the wide rib corresponding to the dummy aperture OPD may be excessively soared to the mother substrate MB so the flatness of the mask ADM may not be maintained. Due to this soaring problem, the deposited emission layer may have the distortion in thickness, or shape. However, as explained and shown in connection to FIG. 4, the soaring problem of the mask ADM can be solved by forming the dummy aperture OPD.

However, the sagging problem may not be perfectly solved by the dummy aperture OPD. For example, when the size of the dummy aperture OPD is very large and then the length of the sub rib SR is too long, the tensile force applied to the sub rib SR and the rib RB by the magnet MG may not be uniform.

For example, when the mask ADM is settled on the mother substrate MB by applying the magnetic force of the magnet MG, a time difference or time delay may be occurred between the time for settling the sub rib SR and the time for settling the rib RB. As the results, the waves may be formed at the sub rib SR as occurring the soaring portion and sagging portion simultaneously.

However, like the mask ADM according to another embodiment of the present disclosure shown in FIG. 5, by further including the mesh structure ME within the dummy aperture OPD, the soaring portions or the sagging portions are not formed. For example, by incorporating the mesh structure ME linking the sub rib SR and the rib RB, the pulling force by the magnet MG can be applied uniformly to the rib RB and the sub rib SR. This will reduce or minimize the aforementioned soaring problem or the sagging problem.

In further embodiments, the pluralities of magnets MG may be spaced apart from each other on one surface of the yoke plate YP. In one embodiment, a distance D between each adjacent magnets MG may have an equal distance (or pitch). For example, as shown in FIG. 7, the distances between the adjacent magnets MG are spaced apart at an even distance. However, in other embodiments, the distance between adjacent magnets MG does not have to be evenly spaced apart. As the size of the substrate SUB may be large, long, and wide, the soaring or the sagging problem may be concentrated towards the central portion CP of the substrate. In this case, in order to mitigate the sagging problem at the central or middle portion of the substrate, more magnets MG may be placed toward the middle portion of the substrate. For example, the distance between adjacent magnets located close to the middle may have smaller distance between each other compared to those adjacent magnets that are distant from the middle portion of the substrate. That is, the distance between adjacent magnets may gradually increase from the middle portion of the substrate to the edge or periphery portion of the substrate.

The free-form electroluminescence display using the mask for free-form display according to the present disclosure may be applied to the various personal devices such as the electric notebooks, the electronic books, the portable multimedia player, the navigation system, the ultra-mobile PC (personal computer), the smart phone, the mobile communication terminal, the mobile phone, the tablet PC, the smart watch, the watch phone or the wearable devices. In addition, it can be applied to the home appliances such as the television set, the notebook computer, the monitor, the microwave, the electric washer and the camera.

The mask for display according to the present disclosure may be explained as follows.

A mask for display according to one embodiment of the present disclosure comprises an aperture corresponding to a display area, a dummy aperture near the aperture, a rib surrounding circumferences of the aperture and the dummy aperture, and a sub rib between the aperture and the dummy aperture.

According to an example of the present disclosure, the rib has a horizontal part disposed along to a horizontal direction and a vertical portion disposed along to a vertical direction. The sub rib is disposed along to a diagonal direction.

According to an example of the present disclosure, the rib has a first width. The sub rib has a second width different from the first width.

According to an example of the present disclosure, the second width is narrower than the first width.

According to an example of the present disclosure, the mask for the display further includes a pixel pattern disposed within the aperture.

According to an example of the present disclosure, the mask for the display further includes a mesh structure within the dummy aperture.

According to an example of the present disclosure, the mesh structure includes a fine rib linking the rib and the sub rib which are surrounding the dummy aperture.

According to an example of the present disclosure, the fine rib has a narrower width than the rib and the sub rib.

A mask for display according to another embodiment of the present disclosure comprises a first aperture corresponding to a display area of a first substrate, a second aperture near to the first aperture within the first substrate, a first rib disposed to at least two sides of the first aperture and to at least two sides of the second aperture, and a second rib disposed between the first aperture and the second aperture.

According to an example of the present disclosure, the first aperture has a free-form shape.

According to an example of the present disclosure, the first rib has a first direction part and a second direction part perpendicular to the first direction part. The second rib has a third direction part different from the first direction part and the second direction part.

According to an example of the present disclosure, the first rib has a first width, and the second rib has a second width different from the first width.

According to an example of the present disclosure, the mask for the display further comprises a plurality of third ribs within the second aperture.

According to an example of the present disclosure, the third rib has mesh type.

According to an example of the present disclosure, the second aperture has a free-form shape.

According to an example of the present disclosure, the first aperture includes a pixel pattern.

According to an example of the present disclosure, the first aperture has larger areas than the second aperture.

Further aspects of a mask according to the present disclosure are provided herein. A mask for forming a display area of a display device includes: a plurality of ribs having a plurality of first rib members along a first direction and a plurality of second rib members along a second direction; a plurality of first apertures formed adjacent to each overlapping locations of the plurality of ribs, each of the plurality of first apertures spaced apart from each other through the first rib member and the second rib member; a plurality of second apertures adjacent to the plurality of first apertures; and a plurality of sub ribs between each of the first apertures and each of the second apertures.

In one embodiment, the first direction is transverse to the second direction.

In one embodiment, the locations of the plurality of first apertures correspond to the display area of the display device.

In one embodiment, each of the sub ribs is connected to the respective first rib member and the second rib member.

The mask according to the present disclosure further includes: a plurality of fine ribs connected in a mesh shape on each of the plurality of second apertures.

In one embodiment, the plurality of fine ribs connects between the sub ribs, the first rib member, and the second rib member in the mesh shape.

The mask according to the present disclosure further includes: a plurality of pixel patterns at the plurality of first apertures.

In one embodiment, each of the pixel pattern is configured to form at least one of red, green, blue, and white color emitting layer.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. In addition, other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A mask for manufacturing a display device having a display area, comprising:
   an aperture corresponding to the display area;
   a dummy aperture adjacent to the aperture;
   a rib surrounding circumferences of the aperture and the dummy aperture;
   a sub rib disposed between the aperture and the dummy aperture; and
   a mesh structure within the dummy aperture,
   wherein the mesh structure includes a fine rib linking the rib and the sub rib surrounding the dummy aperture,
   wherein the fine rib has a narrower width than the rib and the sub rib, and
   wherein the mask has a uniform thickness.

2. The mask of claim 1, wherein the rib has a horizontal member disposed along a horizontal direction and a vertical member disposed along a vertical direction, and
   wherein the sub rib is disposed along to a diagonal direction.

3. The mask of claim 1, wherein the rib has a first width, and
   wherein the sub rib has a second width different from the first width.

4. The mask of claim 3, wherein the second width is narrower than the first width.

5. The mask of claim 1, further comprising:
   a pixel pattern disposed within the aperture.

6. The mask of claim 1, wherein the aperture has a free-form shape.

7. The mask of claim 1, wherein the rib has a first direction part and a second direction part perpendicular to the first direction part, and
   wherein the sub rib has a third direction part different from the first direction part and the second direction part.

8. The mask of claim 1, wherein the rib has a first width, and the sub rib has a second width different from the first width.

9. The mask of claim 1, wherein the dummy aperture has a free-form shape.

10. The mask of claim 1, wherein the aperture includes a pixel pattern.

11. The mask of claim 1, wherein the aperture has larger areas than the dummy aperture.

12. A mask for forming a display area of a display device, comprising:
    a plurality of ribs having a plurality of first rib members along a first direction and a plurality of second rib members along a second direction, wherein the first direction is transverse to the second direction;
    a plurality of first apertures formed adjacent to each overlapping locations of the plurality of ribs, each of the plurality of first apertures spaced apart from each other through the first rib member and the second rib member, wherein locations of the plurality of first apertures correspond to the display area of the display device;
    a plurality of second apertures adjacent to the plurality of first apertures, the first rib members and the second rib members forming a matrix structure, each of the first aperture and the second aperture being arranged within the matrix structure;
    a mesh structure within the second aperture; and
    a plurality of sub ribs between each of the first apertures and each of the second apertures, wherein each of the sub ribs is connected to the respective first rib member and the second rib member,
    wherein the mesh structure includes a fine rib linking the first rib member and the second rib member surrounding the second aperture,
    wherein the fine rib has a narrower width than the first rib member and the second rib member, and
    wherein the mask has a uniform thickness.

13. The mask of claim 12,
    wherein the plurality of fine ribs connects between the sub ribs, the first rib member, and the second rib member in the mesh shape.

14. The mask of claim 12, further comprising:
    a plurality of pixel patterns at the plurality of first apertures, wherein each of the pixel pattern is configured to form at least one of red, green, blue, and white color emitting layer.

* * * * *